(12) United States Patent
Shin et al.

(10) Patent No.: US 10,121,452 B2
(45) Date of Patent: Nov. 6, 2018

(54) DISPLAY DEVICE HAVING COMPENSATING CAPACITORS FOR DIFFERENT WIRING LENGTHS AND METHOD OF MANUFACTURING THE SAME

(71) Applicant: LG DISPLAY CO., LTD., Seoul (KR)

(72) Inventors: Byongwook Shin, Daegu (KR); Jaeho Sim, Daegu (KR); Jungyoup Suk, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 30 days.

(21) Appl. No.: 15/346,046

(22) Filed: Nov. 8, 2016

(65) Prior Publication Data

US 2017/0154606 A1    Jun. 1, 2017

(30) Foreign Application Priority Data

Nov. 26, 2015    (KR) .................. 10-2015-0166483

(51) Int. Cl.
| | |
|---|---|
| *G09G 5/10* | (2006.01) |
| *H01L 27/12* | (2006.01) |
| *H01L 27/32* | (2006.01) |
| *G09G 3/20* | (2006.01) |

(52) U.S. Cl.
CPC .............. *G09G 5/10* (2013.01); *G09G 3/20* (2013.01); *H01L 27/124* (2013.01); *H01L 27/1225* (2013.01); *H01L 27/1255* (2013.01); *H01L 27/1259* (2013.01); *H01L 27/3248* (2013.01); *H01L 27/3276* (2013.01); *G09G 2300/0408* (2013.01); *G09G 2300/0426* (2013.01); *G09G 2310/0278* (2013.01); *G09G 2310/0281* (2013.01); *G09G 2320/0209* (2013.01); *G09G 2320/0223* (2013.01); *G09G 2320/0233* (2013.01); *H01L 2227/323* (2013.01)

(58) Field of Classification Search
CPC ...................................................... G09G 5/10
USPC ............................................................ 345/58
See application file for complete search history.

(56) References Cited

U.S. PATENT DOCUMENTS

| | | | | |
|---|---|---|---|---|
| 2007/0080433 | A1* | 4/2007 | Lai ................. | G02F 1/1345 257/666 |
| 2007/0176868 | A1* | 8/2007 | Lee ................ | G02F 1/13306 345/87 |
| 2009/0303404 | A1 | 12/2009 | Kretz | |
| 2016/0351098 | A1* | 12/2016 | Lin ................. | G09G 3/20 |

FOREIGN PATENT DOCUMENTS

| | | |
|---|---|---|
| CN | 102789755 A | 11/2012 |
| EP | 2065873 A1 | 6/2009 |
| JP | 1185058 A | 3/1999 |

* cited by examiner

*Primary Examiner* — Long D Pham
(74) *Attorney, Agent, or Firm* — Dentons US LLP

(57) ABSTRACT

Provided are a display device and a method of manufacturing the same. A display device comprises a display area, a non-display area, signal lines, and compensating capacitors. The display area and the non-display area are defined on a substrate. The signal lines are located within the display area, and their wiring lengths differ depending on location. The compensating capacitors are connected to at least one of the signal lines.

12 Claims, 13 Drawing Sheets

(a)

(b)

(a)

(b)

(a)

(b)

ered by practice of the invention. These and other advan-
DISPLAY DEVICE HAVING COMPENSATING CAPACITORS FOR DIFFERENT WIRING LENGTHS AND METHOD OF MANUFACTURING THE SAME This application claims the priority benefit of Korean Patent Application No. 10-2015-0166483 filed on Nov. 26, 2015, which is hereby incorporated herein by reference for all purposes as if fully set forth herein.

BACKGROUND

Field

The present disclosure relates to a display device and a method for manufacturing the same.

Discussion of the Related Art

With the development of information technology, the market for displays that play an intermediary role between users and information is growing. Thus, display devices such as organic light-emitting displays (OLEDs), quantum dot displays (QDDs), liquid crystal displays (LCDs), and plasma display panels (PDPs) are increasingly used.

These display devices each comprise a display panel comprising a plurality of subpixels, a drive part that outputs a drive signal to drive the display panel, a power supply that generates and supplies power to the drive part.

A display device comes in a small, medium, or large size. The configuration of the display panel, drive devices (including peripherals) connected to the display panel, and a structure for housing the display panel and the drive devices may vary depending on the desired size, shape, application, etc. of the display device.

The use and usage environment of display devices is becoming more diversified. To cope with this, the shapes of display panels are also changing from a traditional square or rectangular shape to a circular shape as well as a curved shape.

Odd-shaped display devices having display panels with a circular shape, elliptical shape, etc. offer some advantages such as greater freedom of design. However, conventional odd-shaped display devices may have a problem of non-uniform luminance due to variations in parasitic elements (e.g., parasitic capacitance) that may exist between the signal lines of the display panel—that is, differences in luminance between the signal lines.

SUMMARY

Accordingly, the present disclosure is directed to a display device and a method for manufacturing the same that substantially obviate one or more problems due to limitations and disadvantages of the related art.

An advantage of the present disclosure is to provide a display device with improved picture quality.

Additional features and advantages of the present disclosure will be set forth in the description which follows, and in part will be apparent from the description, or may be learned by practice of the invention. These and other advantages of the present invention will be realized and attained by the structure particularly pointed out in the written description and claims hereof as well as the appended drawings.

To achieve these and other advantages and in accordance with the purpose of embodiments of the invention, as embodied and broadly described herein, a display device may, for example, include a display area, a non-display area, signal lines, and compensating capacitors. The display area and the non-display area are defined on a substrate. The signal lines are located within the display area, and their wiring lengths differ depending on location. The compensating capacitors are connected to at least one of the signal lines.

In another aspect, the present disclosure provides a method for manufacturing a display device. The method for manufacturing a display device comprises: defining a display area and a non-display area on a substrate; arranging signal lines whose wiring length differs depending on location, within the display area; and forming compensating capacitors in such a manner that each compensating capacitor is connected to at least one of the signal lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments illustrated in the accompanying drawings, examples of which are illustrated in the accompanying drawings.

Figure 1:
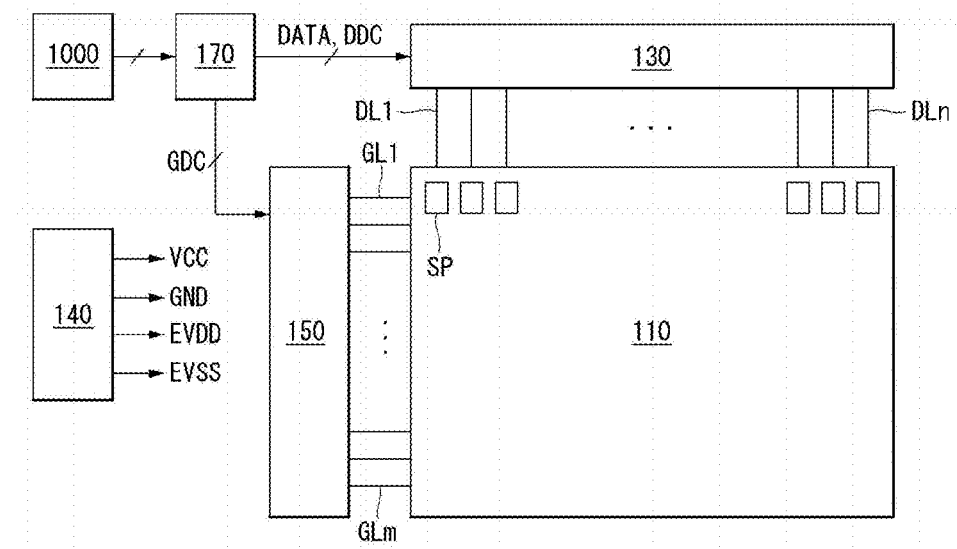
FIG. 1 is a block diagram schematically illustrating a display device according to an exemplary embodiment of the present disclosure.
Figure 2:
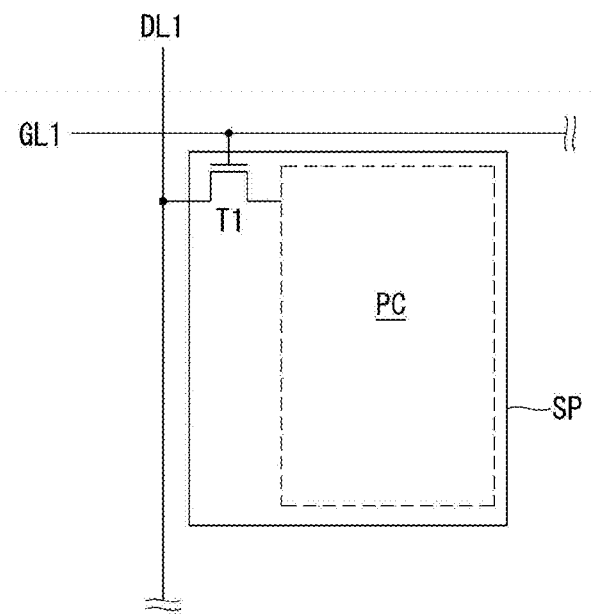
FIG. 2 is a view schematically illustrating a configuration of a subpixel of FIG. 1.

FIG. 1 is a block diagram schematically illustrating a display device according to an exemplary embodiment of the present disclosure. FIG. 2 is a view schematically illustrating a configuration of a subpixel of FIG. 1.

As illustrated in FIG. 1, the display device comprises a host system 1000, a timing controller 170, a data driver 130, a power supply 140, a gate driver 150, and a display panel 110.

The host system 1000 comprises a system-on-chip (SoC) with a scaler embedded in it, and converts digital video data of an input image into a data signal in a format suitable for display on the display panel 110. The host system 1000 transmits various timing signals, together with the data signal, to the timing controller 170.

The timing controller 170 controls the operation timings of the data driver 130 and gate driver 150 based on timing signals, such as a vertical synchronization signal, horizontal synchronization signal, data enable signal, and main clock, received from the host system 1000. The timing controller 170 performs image processing (such as data compensation, etc.) of the data signal received from the host system 1000 and supplies it to the data driver 130.

The data driver 130 operates in response to a first drive signal DDC, etc. output from the timing controller 170. The data driver 130 converts a digital data signal DATA received from the timing controller 170 to an analog data signal and outputs it.

The data driver 130 converts a digital data signal DATA to an analog data signal in response to a gamma voltage GMA of a gamma part 135 provided internally or externally. The data driver 130 supplies a data signal to data lines DL1 to DLn of the display panel 110.

The gate driver 150 operates in response to a second drive signal GDC, etc. output from the timing controller 170. The gate driver 150 outputs a gate signal (or scan signal) at a gate-high voltage or gate-low voltage in response to the second drive signal GDC, etc.

The gate driver 150 may sequentially output a gate signal in a forward or backward direction. The gate driver 150 supplies a gate signal to gate lines GL1 to GLm of the display panel 110.

The power supply 140 produces first and second power-supply voltages EVDD and EVSS for driving the display panel 110 and third and fourth power-supply voltages VCC and GND for driving the data driver 130. Besides, the power supply 140 generates voltages to drive the display device, such as the gate-high voltage, gate-low voltage, etc., that are delivered to the gate driver 150.

The display panel 110 comprises subpixels SP, the data lines DL1 to DLn connected to the subpixels SP, and the gate lines GL1 to GLm connected to the subpixels SP. The display panel 110 displays an image in response to a gate signal output from the gate driver 150 and a data signal DATA output from the data driver 130. The display panel 110 comprises a lower substrate and an upper substrate. The subpixels SP are formed between the lower substrate and the upper substrate.

As illustrated in FIG. 2, one subpixel comprises a transistor T1 connected to the gate line GL1 and data line DL1 (or formed at the intersection), and a pixel circuit PC that operates in response to a data signal DATA supplied through the transistor T1.

The display panel 110 is implemented as a liquid crystal display panel or an organic light-emitting display panel depending on the configuration of the pixel circuits PC of the subpixels SP. If the display panel 110 is implemented as a liquid crystal display panel, it operates in TN (Twisted Nematic) mode, VA (Vertical Alignment) mode, IPS (In-Plane Switching) mode, FFS (Fringe Field Switching) mode, or ECB (Electrically Controlled Birefringence) mode.

If the display panel 110 is implemented as an organic light-emitting display panel, it operates as a top-emission type, bottom-emission type, or dual-emission type.

The above-explained display device may be implemented for a television system, a set-top box, a navigation system, a video player, a Blu-ray player, a personal computer (PC), a wearable device, a home theater system, a mobile phone, etc.

The display panel of the display device may be a liquid crystal display panel, an organic light-emitting display panel, an electrophoretic display panel, a quantum dot display panel, a plasma display panel, etc. For convenience of explanation, a display device having an organic light-emitting display panel will be described below by way of an example of the display panel.

The display device to be described below may come in a small, medium, or large size. By way of example, a small display, which can bring significant power consumption savings compared to medium or large displays, will be described below.

By way of example, a smartwatch, which is a type of small display, according to an exemplary embodiment of the present disclosure will be described. Moreover, the following description will be given of an example in which one pixel consists of red, green, and blue subpixels RGB. However, it should be noted that this is just an illustration and the present disclosure is not limited thereto.

Figure 3:
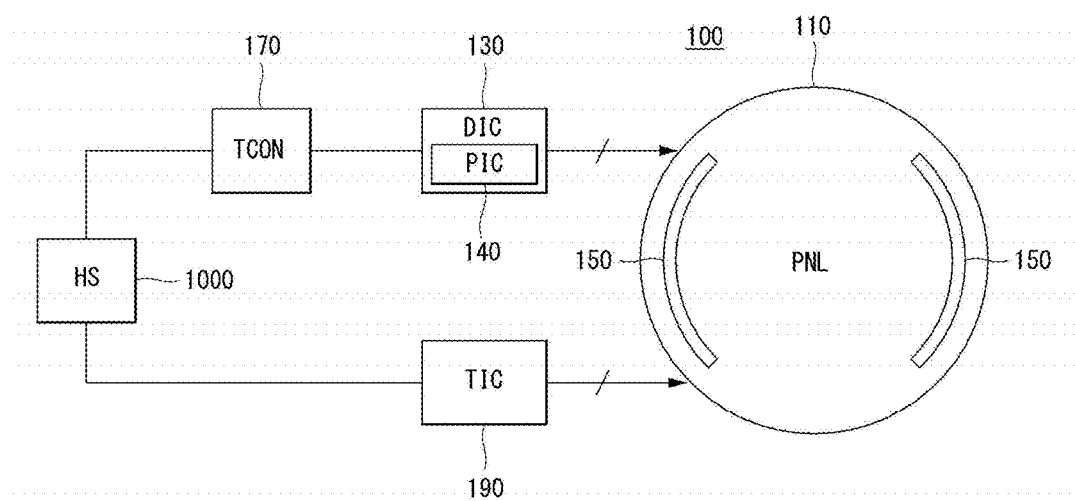
FIG. 3 is a block diagram schematically illustrating a display device for a smartwatch according to an exemplary embodiment of the present disclosure.
Figure 4:
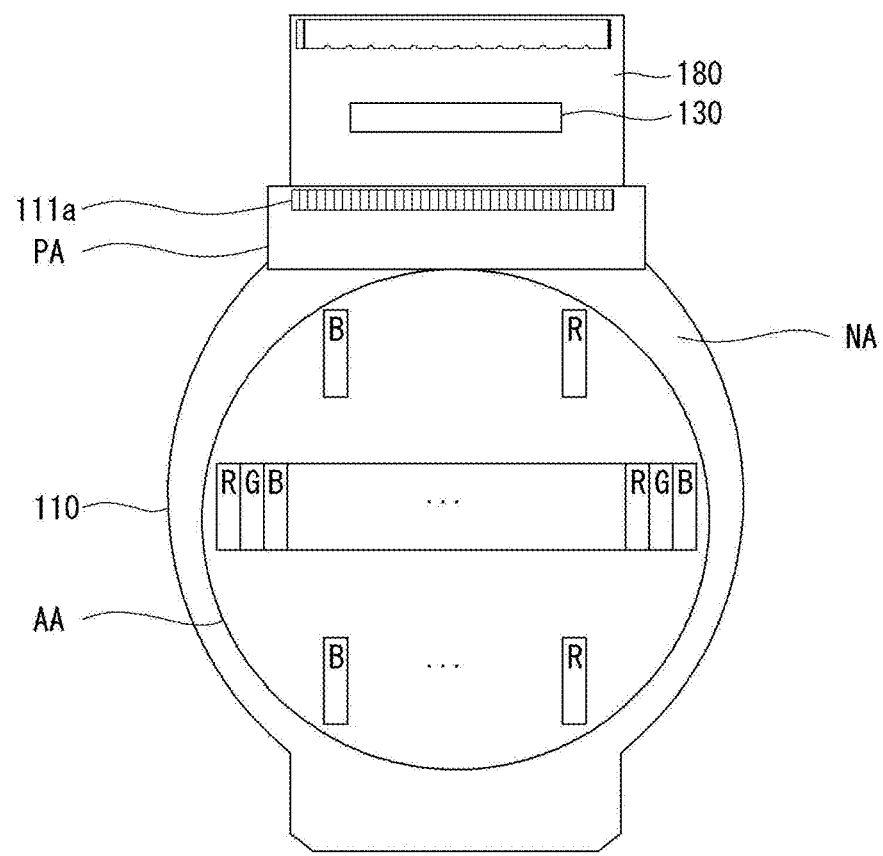
FIG. 4 is a top plan view schematically illustrating a display panel for the smartwatch of FIG. 3.

FIG. 3 is a block diagram schematically showing a display device for a smartwatch according to an exemplary embodiment of the present disclosure. FIG. 4 is a top plan view schematically showing a display panel for the smartwatch of FIG. 3.

As illustrated in FIG. 3, a smartwatch 100 comprises a host system (HS) 1000, a timing controller (TCON) 170, a data driver (DIC) 130, a power supply (PIC) 140, a gate driver 150, a display panel (PNL) 110, and a touch driver (TIC) 190.

The smartwatch 100 corresponds to a small display. In the small display device, some part of the device is integrated to reduce the device's complexity. For example, the power supply 140 may be included within the data driver 130. However, this is just an illustration, and the small display may be implemented in a variety of configurations, including integrating the timing controller 170 and the data driver 130 into a single unit.

The gate driver 150 is embedded in the display panel 110, together with a pixel array. The gate driver 150 embedded in the display panel 110 is formed by the GIP (gate-in-panel) technology, along with a thin-film transistor process.

The smartwatch 100 has the touch driver 190 as touch-type input means to help the user input data. Moreover, the display panel 110 comprises touch sensors that sense a touch position using the touch driver 190 and output the value of the sensed position, and sensor lines that electrically connect the touch sensors and the touch driver 190.

The touch driver 190 detects information on the position of a finger touch using self-capacitive touch sensors or mutual capacitive touch sensors. The touch driver 190 transmits the detected information on the position of the finger touch to the host system 1000. The host system 1000 executes an application associated with the touch position information received from the touch driver 190.

As illustrated in FIG. 4, the display panel 110 may be formed in a circular shape, for example. As well as the circular shape, the display panel 110 may be formed in various shapes including a square shape, rectangular shape, polygonal shape, elliptical shape, etc.

Red, green, and blue subpixels R, G, and B and touch sensors (not shown) are placed in a display area AA of the display panel 110. A pad part 111a may be placed in a pad area PA defined in a non-display area (or bezel region) NA of the display panel 110. By way of example, the pad part 111a is placed on top of the display area AA, but also may be placed under the display area AA.

The data driver 130 with the power supply is mounted on a flexible circuit substrate (film) 180. The flexible circuit substrate 180 is electrically connected to the pad part 111a through an anisotropic conductive film (ACF), etc. Other devices for driving the display panel 110, as well as the data driver 130, may be mounted on the flexible circuit substrate 180.

As stated above, with the diversification of the use and usage environment of display devices, display panels for displaying images are diversifying from a traditional square or rectangular shape to a circular shape as well as a curved shape.

Odd-shaped display devices having display panels with a circular shape, elliptical shape, etc., rather than a square or rectangular shape, offer some advantages such as greater freedom of design. However, conventional odd-shaped display devices may have a problem of luminance non-uniformity due to variations in parasitic elements (e.g., parasitic capacitance) that may exist between the signal lines of the display panel—that is, differences in luminance between the signal lines.

Luminance non-uniformity due to parasitic elements will now be described on the basis of a rectangular display panel and a circular display panel.

Figure 5:
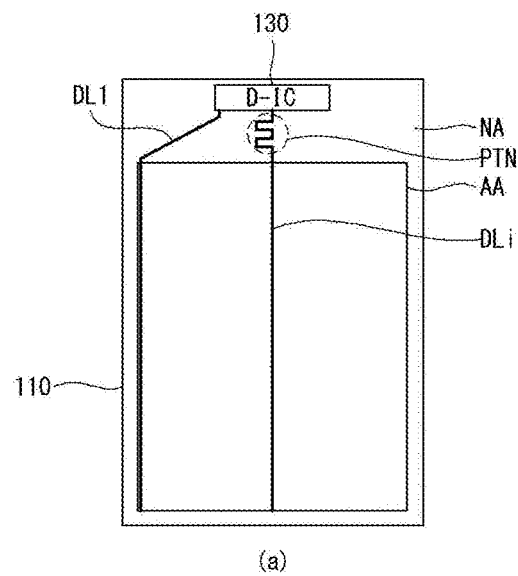
FIG. 5 is a view for explaining a cause of luminance non-uniformity in a rectangular display panel and a circular display panel.
Figure 5:
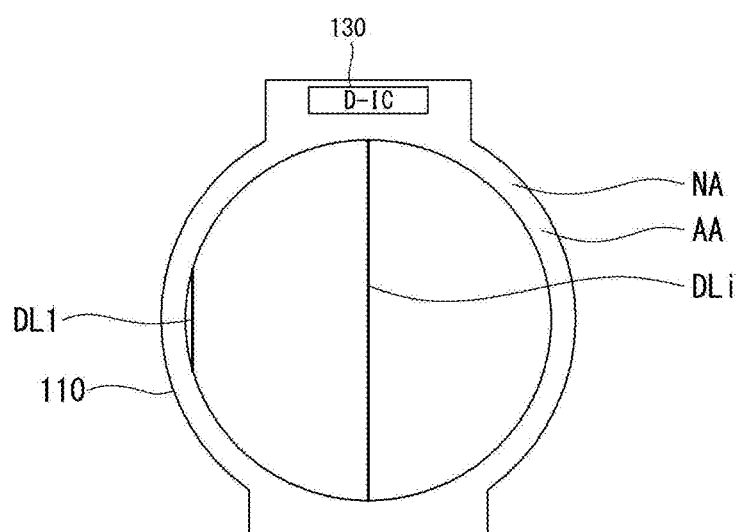
Figure 6:
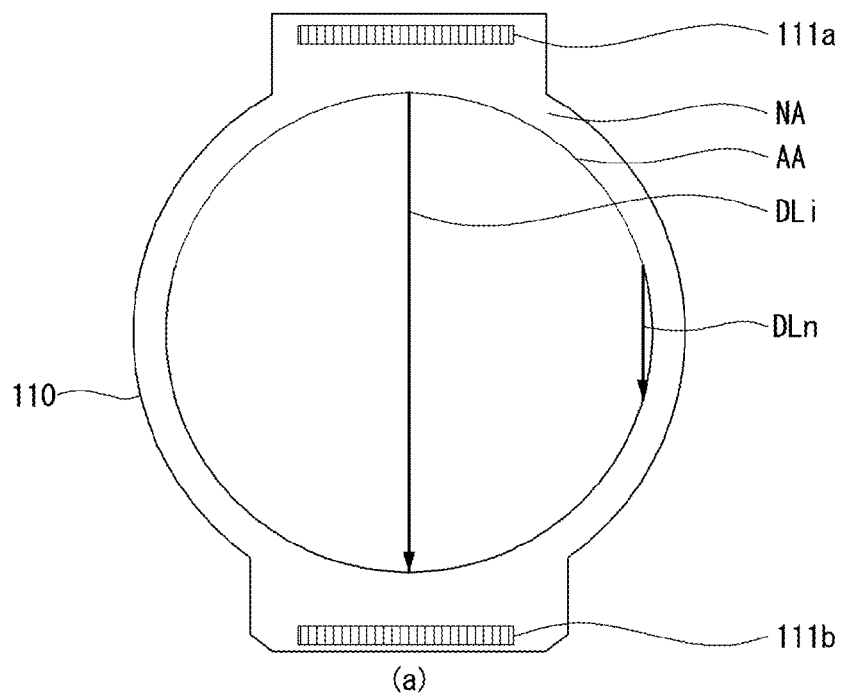
FIG. 6 is a view for explaining a problem with a test example.
Figure 6:
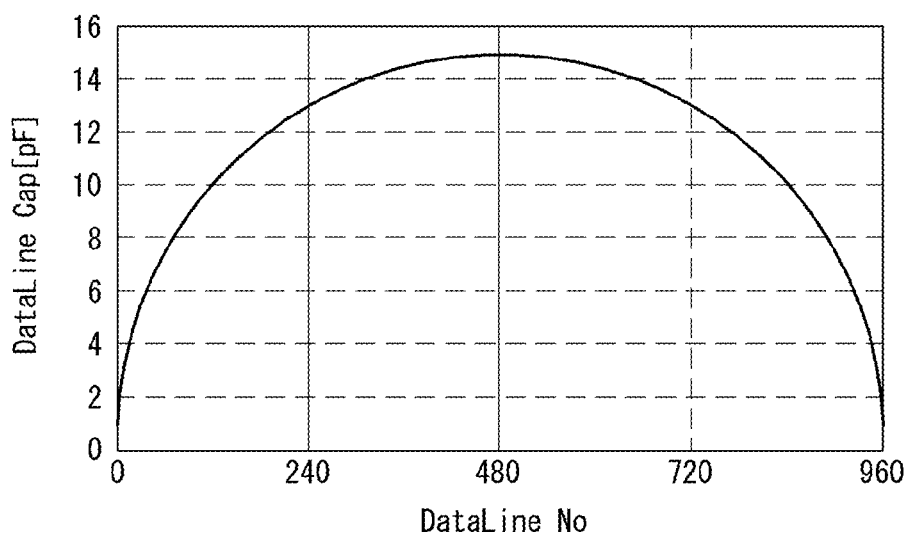
Figure 7:
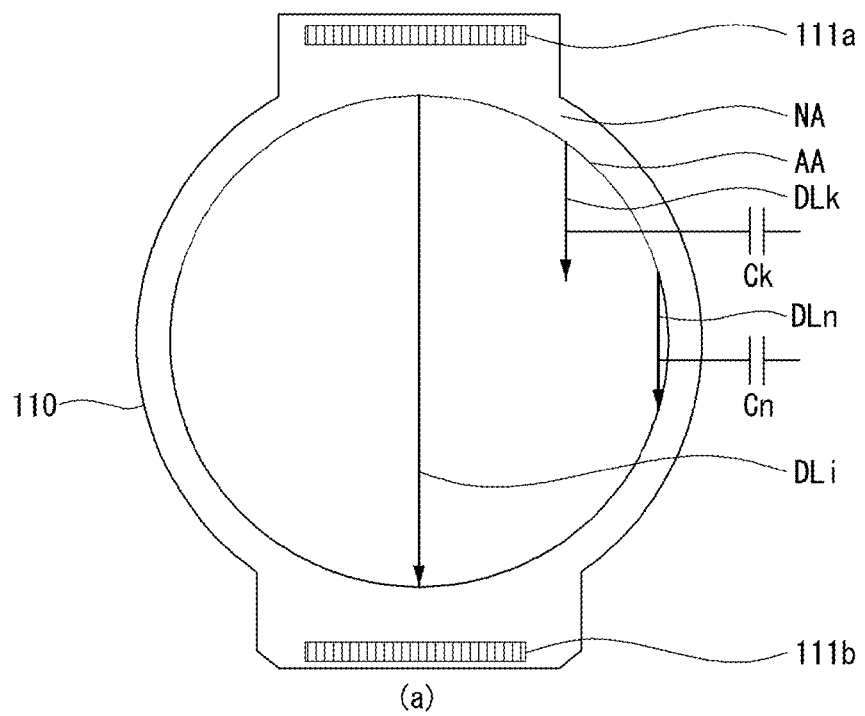
FIG. 7 is a view for explaining a concept of compensation according to an exemplary embodiment of the present disclosure.
Figure 7:
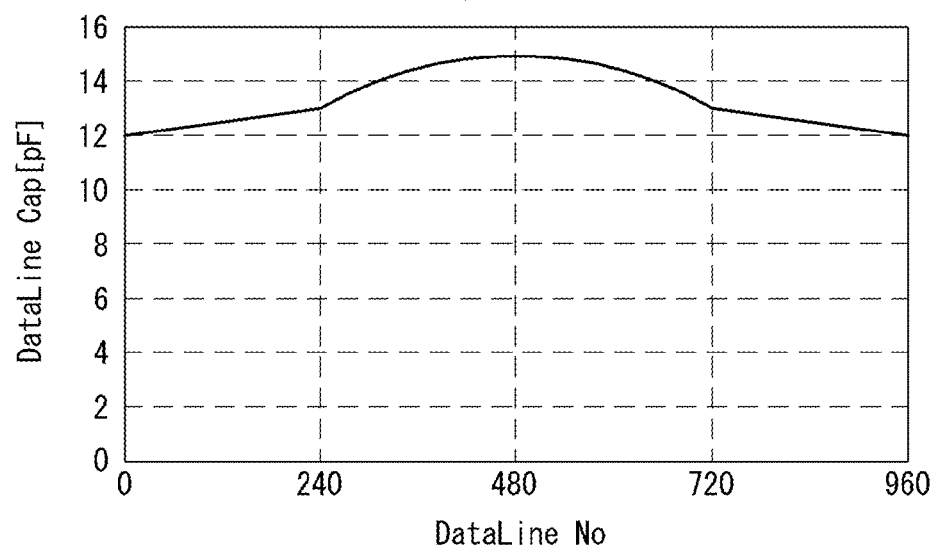
Figure 8:
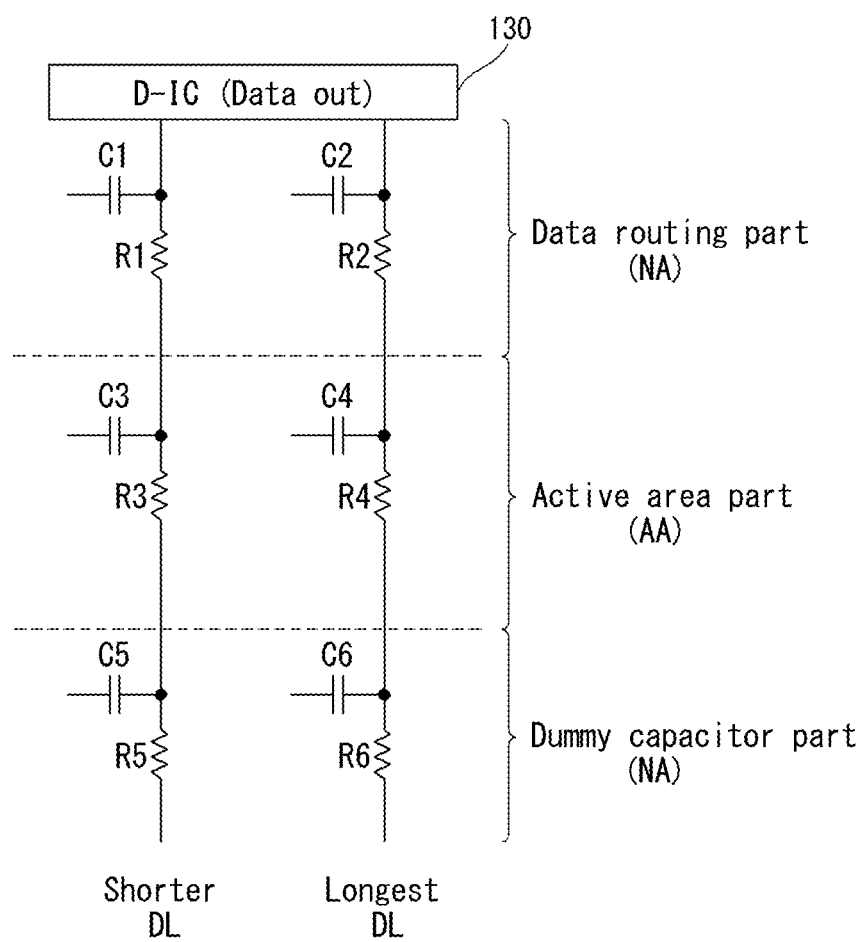
FIG. 8 is a view for explaining a design scheme for a compensating capacitor according to an exemplary embodiment of the present disclosure.

FIG. 5 is a view for explaining a cause of luminance non-uniformity in a rectangular display panel and a circular display panel. FIG. 6 is a view for explaining a problem with a test example. FIG. 7 is a view for explaining a concept of compensation according to an exemplary embodiment of the present disclosure. FIG. 8 is a view for explaining a design scheme for a compensating capacitor according to an exemplary embodiment of the present disclosure.

In a rectangular display panel 110 shown in (a) of FIG. 5, the data lines located within the display area AA are arranged in such a way that they are equal in length. As an example, the first data line DL1 located in the first row on the left side within the display area AA and the ith data line DLi located in the ith row at the center within the display area AA are equal in length. This is because the data line wiring paths remain the same within the display area AA.

By contrast, the data lines located within a link area existing between the data driver 130 and the display area AA are arranged in such a way that at least one of them has a different length. As an example, the first data line DL1 is arranged diagonally within the link area between the data driver 130 and the display area AA, whereas the ith data line DLi located between the data driver 130 and the display area AA is arranged in a straight line and therefore a offset compensation pattern PTN may be added to the link area.

This is because the data line wiring paths change with every Mth line (M is an integer greater than or equal to 1) within the link area. This means that the length of the data lines and the number of pixels connected to the data lines change with every M lines.

In a circular display panel 110 shown in (b) of FIG. 5, the data lines located within the display area AA are arranged in such a way that they are all of different lengths. Also, the data lines located within the link area existing between the data driver 130 and the display area AA are arranged in such a way that at least one of them has a different length.

Structurally speaking, the rectangular display panel may have more extra space like the non-display area NA, as compared to the circular display panel. Accordingly, to overcome the problem of luminance non-uniformity due to variations in parasitic elements (e.g., parasitic capacitance) between signal lines—that is, differences in luminance between the signal lines, a offset compensation pattern PTN may be easily added to the link area between the data driver 130 and the display area AA. With the offset compensation pattern PTN, resistance is kept the same by adjusting the length of the data lines to match the time constant (t=R×C) of a data signal.

By contrast, structurally speaking, the circular display panel can hardly have more extra space like the non-display area NA, as compared to the rectangular display panel. Moreover, the test result showed that adding the offset compensation pattern PTN to the link area to keep resistance the same between the data lines was not enough to solve the problem of luminance non-uniformity.

FIG. 6 shows a circular display panel (in the upper portion) manufactured by the method of a test example and the result (in the lower portion) of measurement of parasitic capacitance between the data lines. In the circular display panel in the test example, the data lines located within the display area AA are of different lengths.

As illustrated in the figure, the ith data line DLi located at the center of the display area AA has the longest wiring length among the data lines, whereas the nth data line DLn located on the right edge of the display area AA has the shortest wiring length among the data lines.

The result of applying a test voltage to the circular display panel of the test example and measuring the capacitor values of the ith data line DLi and nth data line DLn showed that an offset of approximately 13 to 15 pF existed between the ith data line DLi and the nth data line DLn.

Also, it was observed that, after supplying a data voltage to the circular display panel of the test example, the ith data line DLi was charged with a voltage of approximately 0.03 V and the nth data line DLn was charged with a voltage of approximately 0.4 V.

As a consequence, when an image was displayed on the circular display panel of the test example, every variation in the voltage stored in the data lines was fully reflected, as shown in the lower portion of FIG. 6. Accordingly, it was observed that the circular display panel had differences in luminance, which made the left and right areas to look brighter than the center.

In a number of tests conducted to find a solution to the problem of luminance non-uniformity, which may occur in odd-shaped display panels like a circular display panel, based on the test example, the following exemplary embodiment exhibits excellent results, so the concept of this exemplary embodiment will be described.

FIG. 7 shows a circular display panel (in the upper portion) manufactured by the method of an exemplary embodiment and the result (in the lower portion) of measurement of parasitic capacitance between the data lines. In the circular display panel in the exemplary embodiment, the data lines located within the display area AA are of different lengths.

A compensating capacitor Ck or Cn (or dummy capacitor) is added to a data line. One side of the compensating capacitor Ck or Cn may be connected to a data line, and the other side may be electrically floating or connected to a power source (a power source or static source that delivers a particular voltage), as illustrated in the figure.

If the other side of the compensating capacitor Ck or Cn is electrically floating, there is a possibility that its characteristics may vary due to neighboring signal lines, internal or external environment factors, etc. In contrast, if the other side of the compensating capacitor Ck or Cn is connected to a power source, the capacitance of the capacitor remains constant and therefore the possibility of characteristic variation can be avoided.

As illustrated in the figure, the ith data line located at the center of the display area AA has the longest wiring length among the data lines, whereas the nth data line DLn located on the right edge of the display area AA has the shortest wiring length among the data lines.

No compensating capacitor exists on the ith data line DLi. By contrast, a compensating capacitor exists on the nth data line DLn. Also, compensating capacitors exist on the data lines between the ith data line DLi and the nth data line DLn. For example, a compensating capacitor Ck exists on the kth data line DLk between the ith data line DLi and the nth data line DLn.

The compensating capacitors have an appropriate capacitance value depending on the length of each data line. Particularly, the compensating capacitors are set to have a capacitance value that can compensate for variations in parasitic capacitance—the capacitance of parasitic capacitors—between the data lines through a preliminary test.

The result of applying a test voltage to the circular display panel of the exemplary embodiment and measuring the capacitor values of the ith data line DLi, kth data line DLk, and nth data line DLn showed that an offset of approximately 1 to 4 pF existed among the ith data line DLi, kth data line, and nth data line DLn.

Also, it was observed that, after supplying a data voltage to the circular display panel of the exemplary embodiment, the ith data line DLi, kth data line DLk, and nth data line DLn were charged with almost the same/similar voltage so as to overcome the problem of luminance non-uniformity although there are some differences in voltage.

As a consequence, when an image was displayed on the circular display panel of the exemplary embodiment, the variation in the voltage stored in the data lines was cancelled out, as in the lower portion of FIG. 7. Accordingly, it was observed that the differences in luminance on the circular display panel, which made the left and right areas to look brighter than the center, were substantially reduced (or mitigated).

In an embodiment of the present disclosure, the data line wiring area may be largely divided into three sections, and compensating capacitors may be provided in one or more of these sections. For convenience of explanation, the following description will be given with an example where compensating capacitors are provided in the upper and lower portions of the display area.

As illustrated in FIG. 8, the data line wiring area comprises a data routing part, an active area part, and a dummy capacitor part.

The data routing part corresponds to an upper non-display area (or link area) existing between the data driver 130 and the display area AA. The active area part corresponds to a wiring area existing in the display area AA. The dummy capacitor part corresponds to a lower non-display area existing between the display area AA and the non-display area NA.

Compensating capacitors C1, C2, C5, and C6 are provided at the data routing part and dummy capacitor part existing in the upper and lower portions of the display area AA. A design scheme for compensating for variations relative to a shorter data line DL and the longest data line DL among the data lines will be described below.

R1=R2: Resistance is kept the same by adjusting the length of the data lines

R3=n1×R_ unit (n1: (<n2) the number of pixels on the shorter data line)

R4=n2×R_ unit (n2: the number of pixels on the longest data line)

R5, R6: Compensation resistors (or dummy resistors) on the data lines

C3=n1×C_ unit

C4=n2×C_ unit

C1, C2, C5, C6: Compensating capacitors on the data lines in the upper and lower portions of the display area (X·R_ unit, C_ unit: resistors and parasitic capacitors for an array of pixels)

The test result showed that the parasitic capacitors between the data lines may be designed with variation ranging from 1 to 20% by forming the compensating capacitors C1, C2, C5, and C6 on the display panel using the scheme in the exemplary embodiment.

As above, the parasitic capacitors existing on the data lines may be set to have a capacitance value, with variation ranging from 1 to 20%, and the maximum extent of variation is narrowed down to 15%, 10%, 5%, etc. by optimization.

It was observed that, if the parasitic capacitors between the data lines had variation ranging from 1 to 20%, the problem that the left and right sides of the display area look brighter due to luminance non-uniformity could be solved. More preferably, the parasitic capacitors between the data lines may be optimized to have a variation of 1 to 10% or less.

By designing the compensating capacitors C1, C2, C5, and C6 on the display panel using the scheme in the exemplary embodiment and optimizing them, the problem of luminance non-uniformity can be solved.

The compensating capacitors may be placed using one of the following examples.

Figure 9:
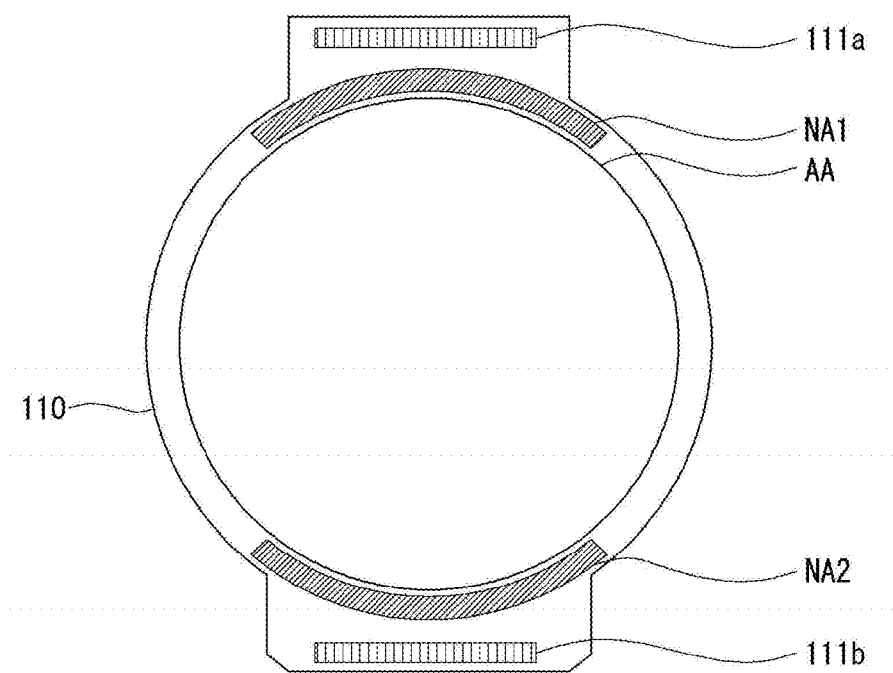
FIG. 9 illustrates a first exemplary placement of compensating capacitors.
Figure 10:
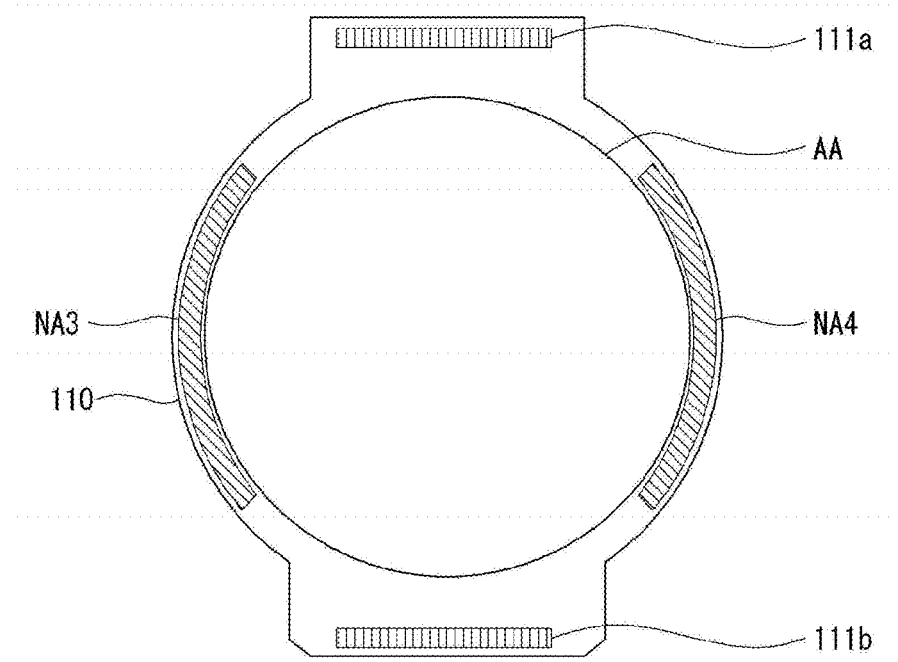
FIG. 10 illustrates a second exemplary placement of compensating capacitors.
Figure 11:
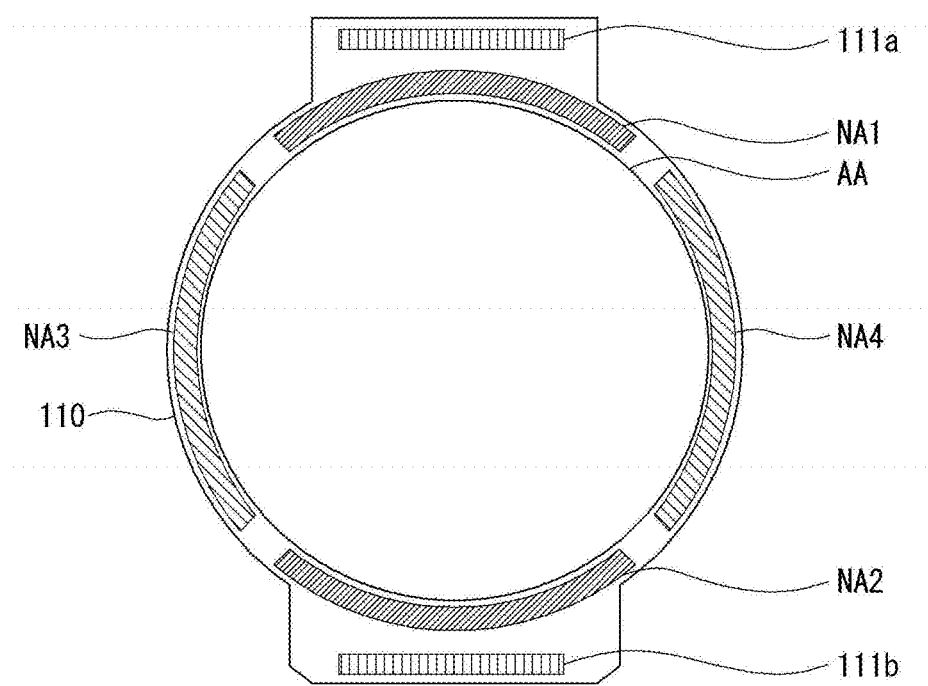
FIG. 11 illustrates a third exemplary placement of compensating capacitors.
Figure 12:
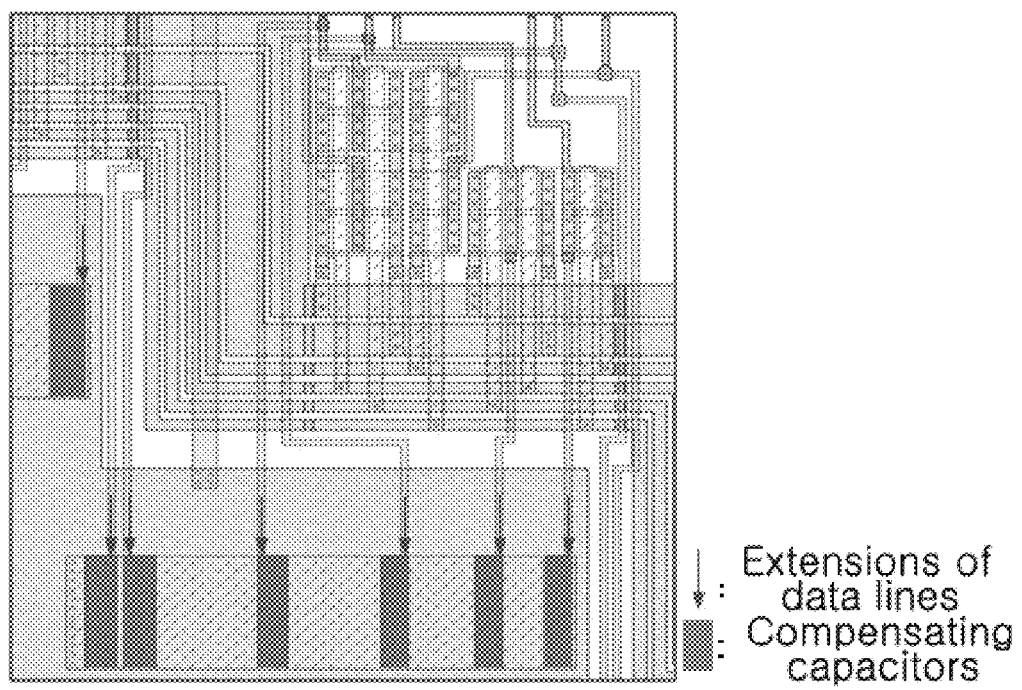
FIG. 12 is a view illustrating a non-display area where compensating capacitors are arranged.

FIG. 9 illustrates a first example of placement of compensating capacitors. FIG. 10 illustrates a second example of placement of compensating capacitors. FIG. 11 illustrates a third example of placement of compensating capacitors. FIG. 12 is a view showing a non-display area where compensating capacitors are arranged.

As illustrated in FIG. 9, the compensating capacitors are arranged in non-display areas NA1 and NA2 provided on the upper and lower sides of the display area AA of the display panel 110. For example, the first and second compensating capacitors C1 and C2 may be arranged in the upper non-display area NA1, and the fifth and sixth compensating capacitors C5 and C6 may be arranged in the lower non-display area NA2.

As illustrated in FIG. 10, the compensating capacitors are arranged in non-display areas NA3 and NA4 provided on the left and right sides of the display area AA of the display panel 110. For example, the first and fifth compensating capacitors C1 and C5 may be arranged in the left non-display area NA3, and the second and sixth compensating capacitors C2 and C6 may be arranged in the right non-display area NA4.

As illustrated in FIG. 11, the compensating capacitors are arranged in non-display areas NA1, NA2, NA3, and NA4 provided on the upper, lower, left, and right sides of the display area AA of the display panel 110. For example, the first, second, fifth, and sixth compensating capacitors C1, C2, C5, and C6 may be arranged in the non-display areas NA1, NA2, NA3, and NA4 provided in the upper, lower, left, and right sides.

As illustrated in FIG. 12, when the area existing between the display area AA and the non-display area NA is viewed on a magnified scale, it is not curved but stepped. Therefore, the first and fifth compensating capacitors C1 and C5 or second and sixth compensating capacitors C2 and C6 in this area have a difference in level as if each data line forms a step-like profile.

The compensating capacitors may have a different capacitance value depending on the length of the data lines, as shown in FIG. 7, and may converge to a single capacitance value in some parts. For example, if the data lines are separated from one another, with differences in level, as shown in FIG. 12, N adjacent data lines (N is an integer is an integer greater than or equal to 2) may be combined into one group, and the compensating capacitor corresponding to this group may converge to a single capacitance value.

Meanwhile, the compensating capacitors C1, C2, C5, and C6 may be provided based on a metal layer (first electrode layer of the compensating capacitors) and an active layer (second electrode layer of the compensating capacitors) metallized by doping, etc., with an insulating film (e.g., inorganic or organic film) interposed between them. Also, the compensating capacitors C1, C2, C5, and C6 may be provided based on M metal layers (M is an integer greater than or equal to 2) and an active layer metalized by doping, etc.

In the above description, the metallized active layer is an active layer that constitutes transistors, etc. for a subpixel, and refers to a layer based on oxide semiconductor (e.g., IGZO). The oxide semiconductor has metal properties, rather than semiconductor properties, by a process such as doping.

The circular display panels of the above-described test example and exemplary embodiment are based on the following subpixel circuit.

Figure 13:
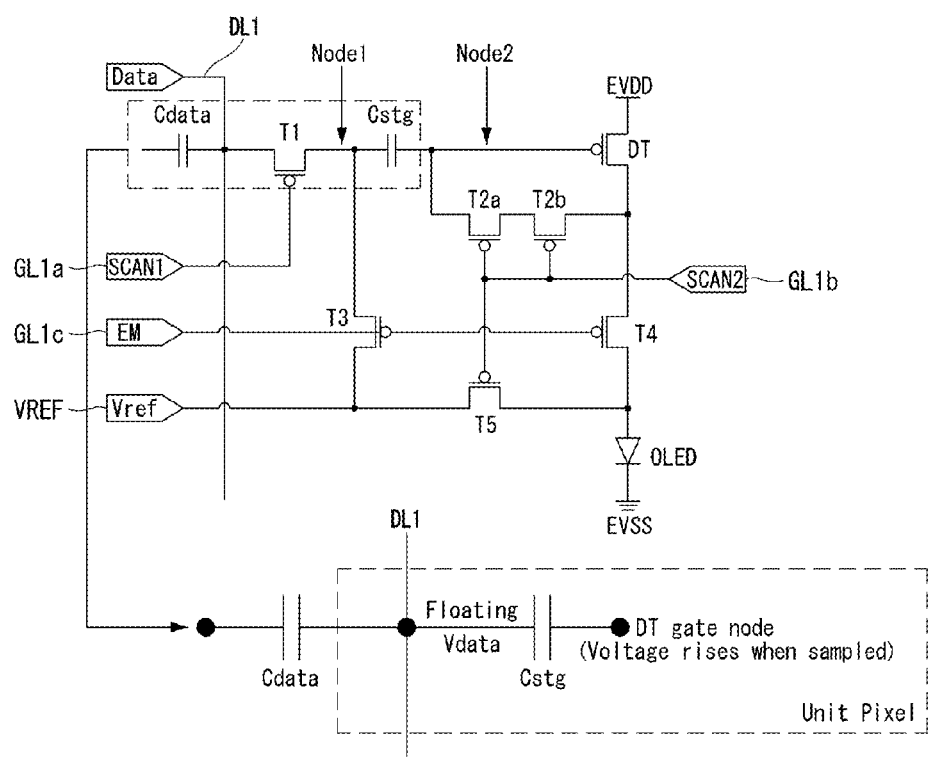
FIG. 13 is a view of a circuit configuration of a subpixel used in the circular display panels of the test example and exemplary embodiment.
Figure 14:
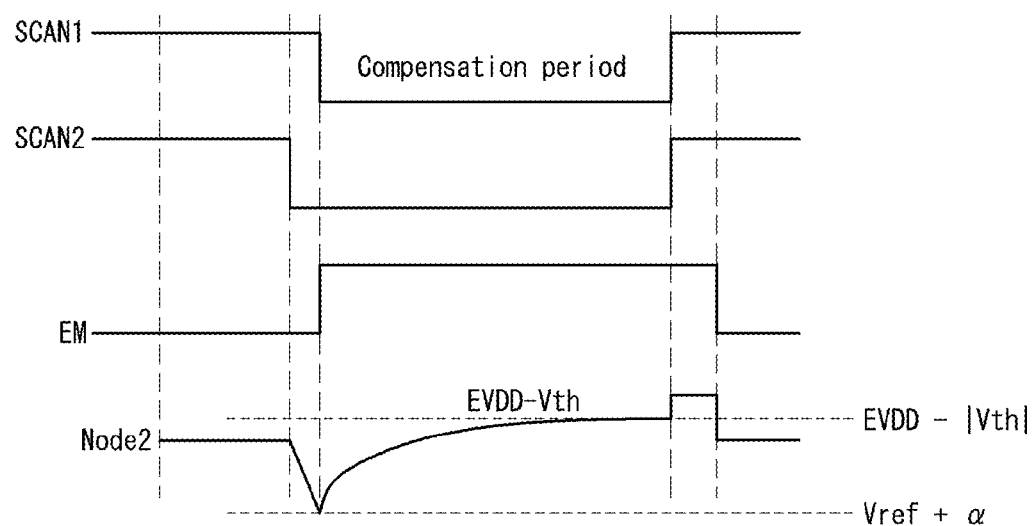
FIG. 14 is a driving waveform diagram of the circular display panel of FIG. 13.

FIG. 13 is a view of the circuit configuration of a subpixel used in the circular display panels of the test example and exemplary embodiment. FIG. 14 is a driving waveform diagram of the circular display panel of FIG. 13.

As illustrated in FIGS. 13 and 14, a subpixel has a 7T (transistor) 1C (capacitor) structure. A second transistor T2a and T2b has a dual-transistor structure by way of example, and also may have a single-transistor structure.

The following description will be given with an example where the transistors included in a subpixel are P-type transistors, but they also may be N-type transistors. As such, the positions of source and drain electrodes may vary depending on the type of the transistors, and the source and drain electrodes may be referred to as first and second electrodes in the following description.

A first transistor T1 has a gate electrode connected to a 1a-th gate line GL1a, a first electrode connected to a first data line DL1, and a second electrode connected to one end of a storage capacitor Cstg. The first transistor T1 serves to deliver a data signal, supplied through the first data line DL1 in response to a 1a-th gate signal SCAN1, to the storage capacitor Cstg.

The 2a-th transistor T2a has a gate electrode connected to a 1b-th gate line GL1b, a first electrode connected to a gate electrode of a driving transistor DT, and a second electrode connected to a first electrode of the 2b-th transistor T2b. The 2b-th transistor T2b has a gate electrode connected to the 1b-th gate line GL1b, a first electrode connected to the second electrode of the 2a-th transistor T2a, and a second electrode connected to a second electrode of the driving transistor DT. The 2a-th transistor T2a and 2b-th transistor T2b serve to make a diode connection between the gate and source electrodes of the driving transistor DT, in response to a 1b-th gate signal SCAN2.

A third transistor T3 has a gate electrode connected to a 1c-th gate line GL1c, a first electrode connected to a reference voltage line VREF, and a second electrode connected to one end of the storage capacitor Cstg. The third transistor T3 serves to supply a reference voltage Vref (or compensation voltage) to one end of the storage capacitor Cstg in response to a 1c-th gate signal EM.

A fourth transistor T4 has a gate electrode connected to a 1c-th gate line GL1c, a first electrode connected to the second electrode of the driving transistor DT, and a second electrode connected to the anode of an organic light-emitting diode OLED. The fourth transistor T4 serves to deliver drive current to the organic light-emitting diode OLED and causes it to emit light in response to the 1b-th gate signal SCAN2.

A fifth transistor T5 has a gate electrode connected to the 1b-th gate electrode, a first electrode connected to the reference voltage line VREF, and a second electrode connected to the anode of the organic light-emitting diode OLED. The fifth transistor T5 serves to supply the reference voltage Vref to the anode of the organic light-emitting diode OLED in response to the 1b-th gate signal SCAN2.

The driving transistor DT has a gate electrode connected to the other end of the storage capacitor Cstg, a first electrode connected to a first power supply line EVDD, and a second electrode connected to the first electrode of the fourth transistor T4. The driving transistor DT turns on in response to a data voltage supplied from the storage capacitor Cstg, and generates a drive current to supply it to the organic light-emitting diode OLED.

The organic light-emitting diode OLED has the anode connected to the second electrode of the fourth transistor T4 and the cathode connected to a second power supply line EVDD. The organic light-emitting diode OLED serves to emit light in response to the drive current delivered through the fourth transistor T4.

The subpixel configured as above has a compensation period during which compensation operation for compensating the threshold voltage Vth of the driving transistor DT is performed. During the compensation period, the compensation operation is performed, including supplying the reference voltage Vref to the reference voltage line VREF and diode-connecting the driving transistor DT.

During the compensation period, the 1a-th gate signal SCAN1 and the 1b-th gate signal SCAN2 are in the logic-low state, and the 1c-th gate signal EM is in the logic-high state. Accordingly, the driving transistor DT is diode-connected, and the first data line DL1 is electrically floating.

Parasitic capacitors exist on the first data line DL1 as explained previously. Thus, the gate node voltage of the driving transistor DT rises when sampled to compensate (EVDD−Vth→EVDD−|Vth|) the threshold voltage Vth of the driving transistor DT.

As in the lower portion of the image of FIG. 13 showing a change in the gate node voltage of the driving transistor DT, voltage is distributed in the direction of "Cstg" and the direction of "Cdata".

In terms of design, while the capacitance of the storage capacitor Cstg is kept the same, voltage varies with the length of the data lines, which results in differences in luminance. For reference, the less Cdata, the stronger the coupling effect. In this case, the differences in luminance due to differences in data voltage depend on the degree of the coupling effect.

Therefore, from the above-described test example in which a circular display panel was manufactured based on subpixels, it was observed that the problem of luminance non-uniformity due to differences in voltage between the data lines ($\alpha$ varies for each data line, as in Reference Voltage Vref+$\alpha$) since a particular voltage such as the reference voltage is supplied during the compensation period.

In contrast, from the above-described exemplary embodiment in which a circular display panel was manufactured based on subpixels, it was observed that that the problem of luminance non-uniformity due to voltage variation during the compensation operation was significantly reduced since the variations in parasitic capacitance are reduced by the compensating capacitors provided on the data lines.

Although the foregoing description has been given of data lines by way of an example of signal lines, the concept of this disclosure may apply to signal lines—that is, lines that provide signals or voltage—which are located in the display area, and whose wiring length differs with respect to a first area. Here, the first area may be defined as the area where the signal line with the longest wiring length, like the ith data line of FIG. 7, among all the signal lines, is placed. The first area may be an area other than the center.

As seen from above, an embodiment of the present disclosure can address luminance non-uniformity and improve display quality by preventing or reducing variations in parasitic elements (e.g., parasitic capacitance) that may exist between the signal lines of an odd-shaped display panel.

Moreover, an embodiment of the present disclosure can prevent or reduce variations in compensating voltage due to differences in the wiring length of signal lines arranged within a display area. In addition, an embodiment of the present disclosure can make the luminance of the display panel uniform by compensating for variations in the capacitance of parasitic capacitors.

What is claimed is:

1. A display device comprising:
    a display area and non-display area defined on a substrate;
    signal lines whose wiring length differs depending on location, which are located within the display area; and
    compensating capacitors each connected to at least one of the signal lines,
    wherein adjacent N signal lines (N is an integer greater than or equal to 2) are combined into one group, and the compensating capacitor corresponding to the group converges to a single capacitance value.

2. The display device of claim 1, wherein the compensating capacitors have a different capacitance value depending on the length of the signal lines.

3. The display device of claim 1, wherein the compensating capacitors are formed so that parasitic capacitors existing between the signal lines have a capacitance value, with variation ranging from 1 to 20%.

4. The display device of claim 1, wherein the compensating capacitors are arranged in non-display areas provided on the upper and lower sides of the display area.

5. The display device of claim 1, wherein the compensating capacitors are arranged in non-display areas provided on the left and right sides of the display area.

6. The display device of claim 1, wherein the compensating capacitors are arranged in non-display areas provided on the upper, lower, left, and right sides of the display area.

7. The display device of claim 1, wherein one end of the compensating capacitors is connected to at least one of the signal lines, and the other end is electrically floating or connected to a power source.

8. The display device of any one of claim 1, wherein the display panel has a curved shape.

9. The display device of any one of claim 1, wherein the display panel has a circular shape.

10. The display device of any one of claim 1, wherein the display panel has an elliptical shape.

11. A method for manufacturing a display device, the method comprising:
    defining a display area and a non-display area on a substrate;
    arranging signal lines whose wiring length differs depending on location, within the display area; and
    forming compensating capacitors in such a manner that each compensating capacitor is connected to at least one of the signal lines,
    wherein adjacent N signal lines (N is an integer greater than or equal to 2) are combined into one group, and the compensating capacitor corresponding to the group converges to a single capacitance value.

12. The method of claim 11, wherein, in the forming of compensating capacitors, the compensating capacitors have a different capacitance value depending on the length of the signal lines.

* * * * *